(12) United States Patent
Tsukagoshi et al.

(10) Patent No.: US 9,691,914 B2
(45) Date of Patent: Jun. 27, 2017

(54) OPTICAL SENSOR DEVICE

(71) Applicant: SII SEMICONDUCTOR CORPORATION, Chiba-shi, Chiba (JP)

(72) Inventors: Koji Tsukagoshi, Chiba (JP); Noriyoshi Higashi, Osaka (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/117,077

(22) PCT Filed: Jan. 27, 2015

(86) PCT No.: PCT/JP2015/052101
§ 371 (c)(1),
(2) Date: Aug. 5, 2016

(87) PCT Pub. No.: WO2015/122565
PCT Pub. Date: Aug. 27, 2015

(65) Prior Publication Data
US 2016/0351731 A1    Dec. 1, 2016

(30) Foreign Application Priority Data

Feb. 18, 2014  (JP) .................................. 2014-028571
Dec. 25, 2014  (JP) .................................. 2014-262224

(51) Int. Cl.
*H01L 31/0203*    (2014.01)
*C03C 3/21*       (2006.01)
(Continued)

(52) U.S. Cl.
CPC ............ *H01L 31/0203* (2013.01); *C03C 3/21* (2013.01); *H01L 31/02005* (2013.01);
(Continued)

(58) Field of Classification Search
CPC ........... H01L 31/0203; H01L 31/02005; H01L 31/02164; H01L 31/02322;
(Continued)

(56) References Cited

U.S. PATENT DOCUMENTS 7,498,145 B2*  3/2009  Uchiyama ........ G01N 33/54373
                                                        385/12
2013/0000355 A1  1/2013  Oku et al. ........................ 65/31
2016/0194496 A1*  7/2016  Okawa .................. C07F 7/0859
                                                        257/100

FOREIGN PATENT DOCUMENTS

CN    101823341    9/2010
CN    102856396    1/2013
(Continued)

OTHER PUBLICATIONS

International Search Report mailed Apr. 7, 2015 in International Application No. PCT/JP2015/052101 together with English-language translation thereof.
(Continued)

*Primary Examiner* — Tu-Tu Ho
(74) *Attorney, Agent, or Firm* — Adams & Wilks (57) ABSTRACT

The following configuration is adopted in order to provide a highly reliable optival sensor device which enhances the reliability of devices without making the devices unsuitable for size and thickness reductions. The light sensor comprises an element-mounting portion (3) having a cavity and a lid member closely attached thereinto, the lid member being composed of: a window (2) constituted of a phosphate-based glass to which properties approximate to a spectral luminous efficacy properties have been imparted by compositional control; and a frame (1) constituted of a phosphate-based glass having light-shielding properties. The lid member is a Laminated glass member obtained by cutting the phosphate-based glass having the spectral luminous efficacy properties (Continued)

into individual pieces, fitting the glass piece into the opening of the phosphate-based glass (1) having light-shielding properties, the opening having been formed so as to have a size approximately equal to the cavity size, and melting and integrating the glasses member.

7 Claims, 4 Drawing Sheets

(51) Int. Cl.
*H01L 31/02* (2006.01)
*H01L 31/0216* (2014.01)

(52) U.S. Cl.
CPC .......... *H01L 31/02164* (2013.01); *H01L 2224/48091* (2013.01); *H01L 2224/48247* (2013.01); *H01L 2224/48465* (2013.01); *H01L 2224/73265* (2013.01); *H01L 2924/181* (2013.01)

(58) Field of Classification Search
CPC . H01L 2224/32245; H01L 2224/48091; H01L 2924/181; C03C 3/21

USPC ........................................................ 257/434

See application file for complete search history.

(56) References Cited

FOREIGN PATENT DOCUMENTS

| CN | 103258833 | 6/2013 |
|----|-----------|--------|
| JP | 2006001808 | 1/2006 |
| JP | 2006213546 | 8/2006 |
| JP | 2007036264 | 2/2007 |
| JP | 2009267396 | 11/2009 |
| JP | 2012238812 | 12/2012 |
| JP | 2013011818 | 1/2013 |
| JP | 2013110307 | 6/2013 |

OTHER PUBLICATIONS

First Office Action together with English language translation thereof, issued on Apr. 5, 2017 by the Chinese Patent Office Chinese in Application No. 201580008833.5.

* cited by examiner

OPTICAL SENSOR DEVICE

TECHNICAL FIELD

The present invention relates to an optical sensor device using phosphate-based glass.

BACKGROUND ART

In recent living environments, convenience has been further improved by electronics, household electric appliances, in-vehicle devices, and the like which are equipped with a new function that is not found in the related art. As a background thereof, it can be said that sensor functions, which compensates the five senses of human beings, are a large portion. Increases in the number of these products have been significantly expected in a wide range of fields. Examples of a sensor include various sensors using a semiconductor, and various sensors including a pressure sensor, a flow rate sensor, a motion sensor, a luminance sensor, a distance measurement sensor, and the like have been made into products.

Among the sensors, an optical sensor including the luminance sensor has been frequently used, and has been spreading widely due to an increase in mounting on an illuminating device for an office or a house, a portable terminal, a computer, and the like for use accompanied with low power consumption. Products, on which the sensor component is mounted, have characteristics in which diversification of application, abundance of functions, and a design excellent in portability are favorable. In addition, a reduction in size, thickness, and cost, and high reliability are required in the products without exception. Among these requirements, a requirement for a package occupies a large portion. According to this, in development of the package, application of the related art or of new technologies has become increasingly important.

Figure 7:
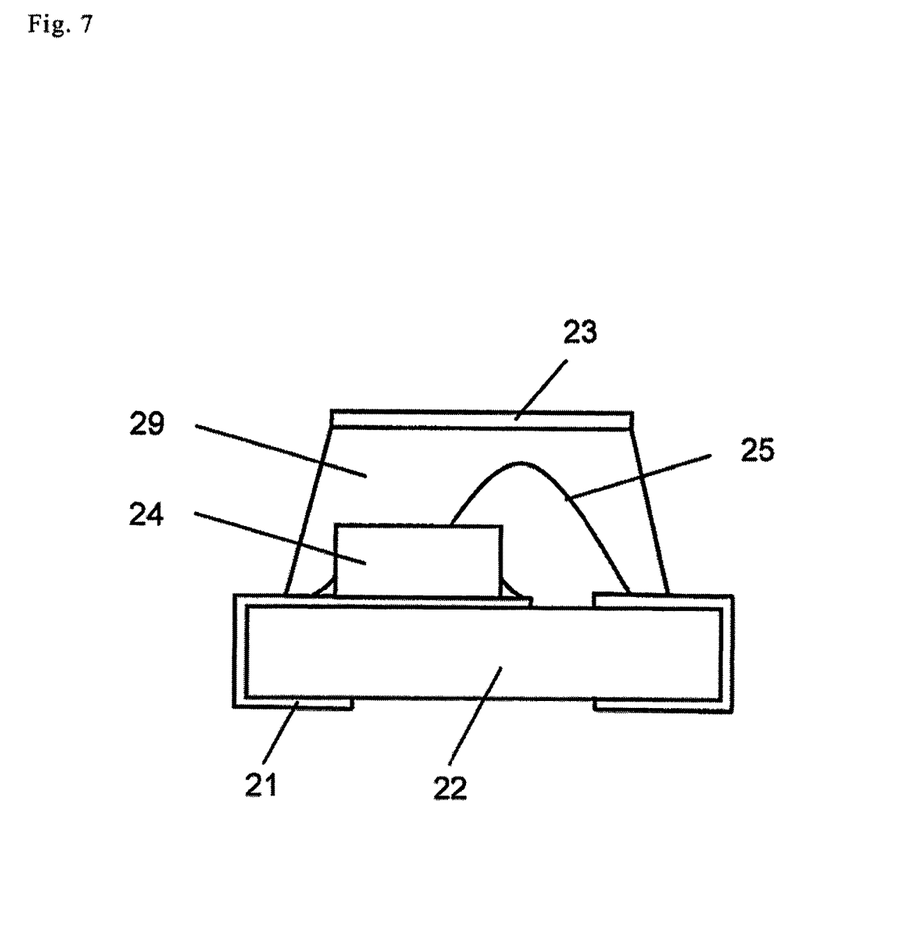
FIG. 7 is a cross-sectional view schematically showing a configuration of a semiconductor device of the related art.

FIG. 7 is an example of a cross-sectional view of a packaged optical sensor. An optical sensor element 24 is mounted on an insulating substrate 22 on which an interconnection pattern 21 is formed through metallization, and a light-transmitting epoxy resin 29 is molded at the periphery of the optical sensor element 24 (FIG. 2 of Patent Document 1). In the package, the periphery of the optical sensor element is molded with the light-transmitting epoxy resin, and a resin 23, which uses a composition of blocking an infrared light beam, is provided in a layer shape to overlap a flat surface of an outer surface of the light-transmitting epoxy resin in a layer shape in an immediate upward direction of the optical sensor element.

As the optical sensor element 24 that is mounted, a light-receiving sensor element is used. The interconnection pattern 21, which is obtained through metallization, is electrically connected to an electrode provided on an upper surface of the optical sensor element 24 through a wire 25, and is used as a connection terminal with an outer side. An electromotive force, which is generated by a light beam that is incident to the light-receiving sensor element, is transmitted to an external connection terminal through the wire 25. Light beams, which are incident from an outer side in an immediate upward direction of the optical sensor element, are transmitted through the light-transmitting epoxy resin after an infrared light beam is blocked by the resin 23, and thus the optical sensor element is sensitive to light beams in a manner close to spectral luminous efficacy properties specific to human beings.

However, in the package structure described in Patent Document 1, the resin having a composition of blocking an infrared light beam is provided on the outer surface of the light-transmitting resin that molds the periphery of the element only in the immediate upward direction of the element. Therefore, with respect to light beams which are incident from an oblique direction, or light beams which are incident from a lateral direction, it is difficult to block the infrared light beam, and it is difficult for the element to receive light beams having characteristics on which the spectral luminous efficacy properties are reflected. According to this, it is difficult to obtain sufficient spectral luminous efficacy properties with respect to light beams which are incident from the lateral direction or the oblique direction. As a result, it is difficult to obtain high light reception characteristics.

In addition, the package has a structure in which the periphery of the element is molded only with the light-transmitting transparent epoxy resin. It is known that the light-transmitting transparent epoxy resin is weak to heat and moisture. When discoloration of the resin occurs due to heat, the transmittance decreases. Therefore, light beams incident from an outer side are attenuated. As a result, an intensity of the light received by the optical sensor element decreases, and this decrease leads to deterioration in light reception sensitivity. In addition, the resin becomes brittle due to heat and peeling-off or cracking is likely to occur between the resin and the element. In addition, light beams incident from an outer side are attenuated, and this leads to a decrease in the optical intensity of the element, and a deterioration in the light reception sensitivity.

In addition, the light-transmitting transparent epoxy resin is likely to swell due to the effect of moisture, and the strength of the swelled resin is likely to decrease, Accordingly, there is a concern of the molded resin being deformed or broken due to impact from an outer side. In addition, the adhesiveness of the resin is likely to decrease due to an effect of moisture, and the moisture is likely to intrude from an interface between the resin and the element. In a case where moisture is interposed between adhesive surfaces of the resin and the element, the adhesiveness of the resin significantly decreases, and this leads to occurrence of interface peeling-off between the element and the resin. In addition, when heat is applied, moisture rapidly evaporates. Accordingly, a popcorn phenomenon occurs, and is accompanied with occurrence of cracking of the resin in addition to spreading of the interface peeling-off Therefore, light beams incident from an outer side are attenuated, and the attenuation leads to a decrease in optical intensity to the element, and partial breakage of the mold resin. As a result, it is difficult to obtain high reliability.

In addition, the resin which is provided on an outer surfaced of the light-transmitting transparent mold resin to block an infrared light beam is also a resin-based dye. Accordingly, there is a concern that a decrease in characteristics of the resin is also likely to occur due to heat or moisture. Particularly, in a case of the resin provided with specific properties of blocking an infrared light beams due to a composition or a structure of the resin, it is typically pointed out that characteristics tend to be unstable due to occurrence of leakage of the dye with respect to external factors such as heat and moisture. When both of the light-transmitting transparent resin that molds the periphery of the element, and the resin that blocks an infrared light beam deteriorate, a plurality of resin factors, which have an effect on the reliability, exist. As a result, it is difficult to obtain high reliability.

In addition, when miniaturization and thinning of the package are performed, the thickness of the mold resin further decreases. According to this, the peeling-off of the resin, the cracking, the discoloration, and the like are further likely to occur, and a decrease in mechanical strength or easiness of deformation also occurs. As a result, the reliability of the package is further likely to deteriorate.

A method of obtaining spectral luminous efficacy properties by using a material other than the resin, or a package having a hollow structure in which the periphery of the element is not molded with the resin have been partially put into practical use. In a case of the method of obtaining the spectral luminous efficacy properties by using a material having a reliability higher than that of the resin-based dye, a variation in the spectral luminous efficacy properties and a decrease in light reception sensitivity of the element due to resin factors, such as deterioration, peeling-off, and cracking of the resin, disappear. As a result, the stability of the characteristics over a long period of time is realized. In addition, when employing the hollow structure in which molding of the periphery of the element with the resin is not performed, the element does not receive a stress due to the resin. Accordingly, it is possible to remove a factor which greatly damages a function relating to a product, such as stress damage on the element and wire disconnection. As a result, it is possible to realize a package with high reliability.

PRIOR ART DOCUMENT

Patent Document

[Patent Document 1] Japanese Unexamined Patent Application, First Publication No. 2007-36264

DISCLOSURE OF THE INVENTION

Problems to be Solved by the Invention

Accordingly, an object of the invention is to newly manufacture glass of a composition having high reliability and spectral luminous efficacy properties, and to provide a highly reliable optical sensor device that has a hollow structure and is capable of being miniaturized as a package by using the new glass that is obtained.

Solution to Problem

According to an aspect of the invention, an optical sensor device constituted by a package includes a lid member that is formed by using phosphate-based glass having the spectral luminous efficacy properties provided through adjustment to a specific composition, and an element-mounting portion having a cavity covered with the lid member. The lid member has a structure in which phosphate-based glass having the spectral luminous efficacy properties is disposed at a portion immediately over an element that is mounted on the element-mounting portion, and the periphery of the phosphate-based glass is constituted by phosphate-based glass having light-shielding properties of absorbing light beams including an ultraviolet light beam, a visible light beam, and an infrared light beam in an absorbance of 2% or less. The lid member has a structure in which the central portion of the phosphate-based glass having the light-shielding properties and a wafer shape is opened in advance. In addition, individual pieces of phosphate-based glass having the spectral luminous efficacy properties are embedded in the opened site, and are melted and integrated to obtain a laminated glass member, thereby obtaining the lid member. According to this, in comparison to a structure in which the infrared light beam is blocked by using a resin to obtain the spectral luminous efficacy properties, it is possible to further remove resin stress, and it is possible to solve problems relating to discoloration or peeling-off of the resin, variations in the spectral luminous efficacy properties in accordance with occurrence of cracking, and a decrease in light reception sensitivity.

In addition, as the phosphate-based glass having the spectral luminous efficacy properties, phosphate-based glass having transmittance characteristics, in which a central peak of a transmittance is in a wavelength range of 540 nm to 560 nm, the transmittance in a wavelength range of 700 nm to 1200 nm is 2% or less, and the transmittance in a wavelength range of 300 nm to 430 nm is 3% or less, may be used.

In addition, as the phosphate-based glass having the light-shielding properties, phosphate-based glass having transmittance characteristics in which the transmittance in a wavelength range of 300 nm to 1200 nm is 2% or less is used In addition, in the element-mounting portion having the cavity, a member formed from resin, ceramic, metal, or glass may be used.

Effects of Invention

According to the optical sensor device of the invention, in the package that is constituted by the lid member using the phosphate-based glass and the element-mounting portion having the cavity, the lid member in which the phosphate-based glass having the spectral luminous efficacy properties and the phosphate-based glass having the light-shielding properties are integrated together is used. Accordingly, it is possible to realize a highly reliable package capable of continuously obtaining stable spectral luminous efficacy properties that is less susceptible to the effect of an environment with ambient heat and moisture.

The lid member has a structure in which the phosphate-based glass having the spectral luminous efficacy properties is combined to the wafer-shaped phosphate-based glass having the light-shielding properties, and the phosphate-based glass having the spectral luminous efficacy properties is disposed in an immediate upward direction of an element. The phosphate-based glass having the spectral luminous efficacy properties has transmittance characteristics in which the central peak of transmittance is in a wavelength range of 540 nm. to 560 nm, the transmittance in a wavelength range of 700 nm to 1200 nm is 2% or less, and the transmittance in a wavelength range of 300 nm to 430 nm is 3% or less, and individual, pieces of the phosphate-based glass are embedded in the phosphate-based glass having the light-shielding properties. The phosphate-based glass having the light-shielding properties is constituted by wafer-shaped glass having transmittance characteristics in which the transmittance in a wavelength range of 300 nm to 1200 nm is 2% or less. The phosphate-based glass having the light-shielding properties has a structure in which an opened site is provided in advance, and the individual pieces of the phosphate-based glass having the spectral luminous efficacy properties can be embedded in the opened site.

Compositions of the phosphate-based glass having the spectral luminous efficacy properties and the phosphate-based glass having the light-shielding properties are adjusted to specific compositions so as to obtain light-transmitting characteristics.

Accordingly, the coefficients of expansion thereof can be made to be equal to each other, and strong reliability with respect to weather resistance such as high-temperature and high-humidity is provided. According to this, with regard to light beams incident from an immediate upward direction of an element, and an oblique direction, a light beam, which passes through the phosphate-based glass having the spectral luminous efficacy properties, is incident to an element. In addition, light beams, which are incident from a wider angle direction in comparison to the oblique direction, are completely shielded by the phosphate-based glass having the light-shielding properties. Accordingly, the element can stably receive light beams with which the spectral luminous efficacy properties are obtained. In addition, the glass composition has high weather resistance in which a hydrate is less likely to be generated. As a result, it is possible to provide an optical sensor device with high reliability.

DESCRIPTION OF EMBODIMENTS

Figure 1:
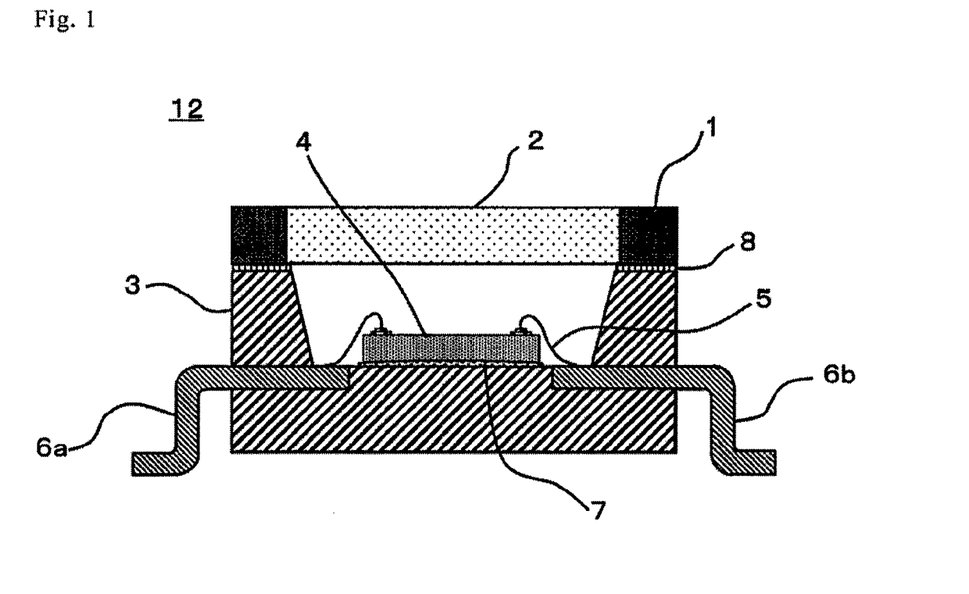
FIG. 1 is a cross-sectional view schematically showing a configuration of a semiconductor device of the invention.

An optical sensor device of the invention has the following structure. A lid member is obtained by embedding one of two kinds of phosphate-based glass having light-transmitting characteristics different from each other through composition adjustment in the other in combination with each other, an element-mounting portion has a cavity, and an element is stuck to the element-mounting portion with an adhesive. An electrode provided on an upper surface of the element is electrically connected to an interconnection surface on which the element is not mounted through a wire. The element is fixed to be surrounded by the element-mounting portion having the cavity. FIG. 1 schematically shows a cross-sectional configuration of the optical sensor device of the invention.

The lid member is constituted by the two kinds of phosphate-based glass having optical characteristics different from each other through adjustment to a specific composition. A window constituted by phosphate-based glass having the spectral luminous efficacy properties is located in an immediate upward direction of the element-mounting portion, and a frame constituted by phosphate-based glass having light-shielding properties is located at the periphery of the window. An opened site is provided in the phosphate-based glass that has a wafer shape and the light-shielding properties in advance, and the phosphate-based glass having the spectral luminous efficacy properties is embedded in the opened site to be integrally formed.

A composition of the phosphate-based glass having the spectral luminous efficacy properties contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO; and
a composition of the phosphate-based glass having the light-shielding properties contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 1% to 5% of CoO,
7) 3% to 10% of CuO,
8) 5% to 15% of $V_2O_5$, and
9) 1% to 5% of NiO.

According to the compositions, the spectral luminous efficacy properties, the light-shielding characteristics, and weather resistance, which are higher than those in phosphate-based glass of the related art, are provided.

The phosphate-based glass having the spectral luminous efficacy properties are composed of individual pieces and the opened site is provided in the wafer-shaped phosphate-based glass having the light-shielding properties. The individual pieces of phosphate-based glass are embedded in the opened site, and are heated to constitute a melt-integrated laminated glass member.

In the element-mounting portion having the cavity, a member that is formed from resin, ceramic, metal, glass, or silicon is used.

The element-mounting portion having the cavity has a hollow structure in which an upper surface of the cavity and the glass lid member are closely attached to each other.

Example 1

Hereinafter, a configuration of the optical sensor device of this example will be described with reference to the accompanying drawings.

Figure 2:
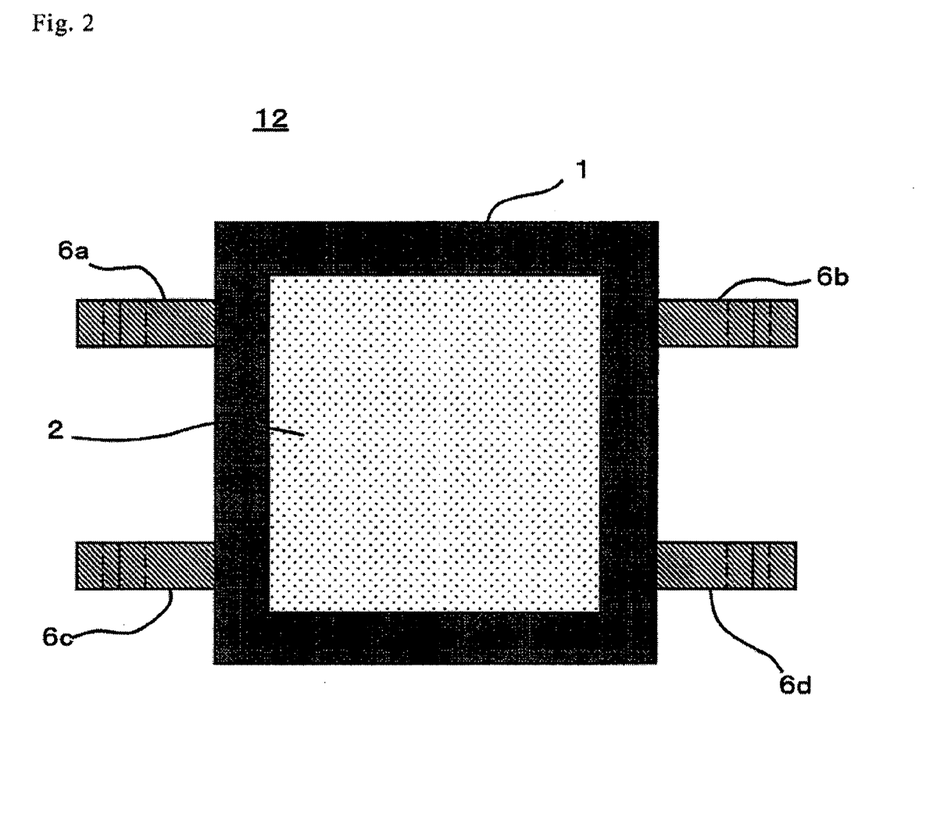
FIG. 2 is a front elevation view schematically showing a configuration of the semiconductor device of the invention.

FIG. 1 is a schematic diagram of an optical sensor device 12 of this example. FIG. 1 is a longitudinal cross-sectional view of the optical sensor device 12. FIG. 2 is a front elevation view of the optical sensor device 12. A hollow structure is obtained by closely attaching a lid member, in which a window 2 constituted by first phosphate-based glass having the spectral luminous efficacy properties is introduced into a frame 1 that surrounds the periphery of the window 2 and is constituted by second phosphate-based glass having light-shielding properties to be integrally formed as a laminated glass member, to an upper surface of the element-mounting portion 3 having a cavity. The element-mounting portion 3 having the cavity has a structure in which lead frames 6a and 6b is fitted into the element-mounting portion 3. A surface of a part of the lead frames 6a and 6b on one side is exposed to a bottom portion of the cavity, and a part on the other side is exposed to an outer side through the cavity and functions as an external terminal. An element mount portion is provided to the cavity bottom portion, and an element 4 is stuck to the center of the element mount portion with an adhesive 7.

Here, the lid member that is constituted by the phosphate-based glass, includes the window 2 constituted by the first phosphate-based glass having the spectral luminous efficacy properties, and the frame 1 constituted by the second phosphate-based glass having the light-shielding properties. The lid member has a structure in which an opened site is provided in wafer-shaped phosphate-based glass in advance, and individual pieces of phosphate-based glass are embedded in the opened site.

The first phosphate-based glass that constitutes the window 2 has the following spectral luminous efficacy properties, and a composition thereof contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CoO,
7) 1% to 5% of $V_2O_5$, and
8) 1% to 5% of NiO.

Figure 6:
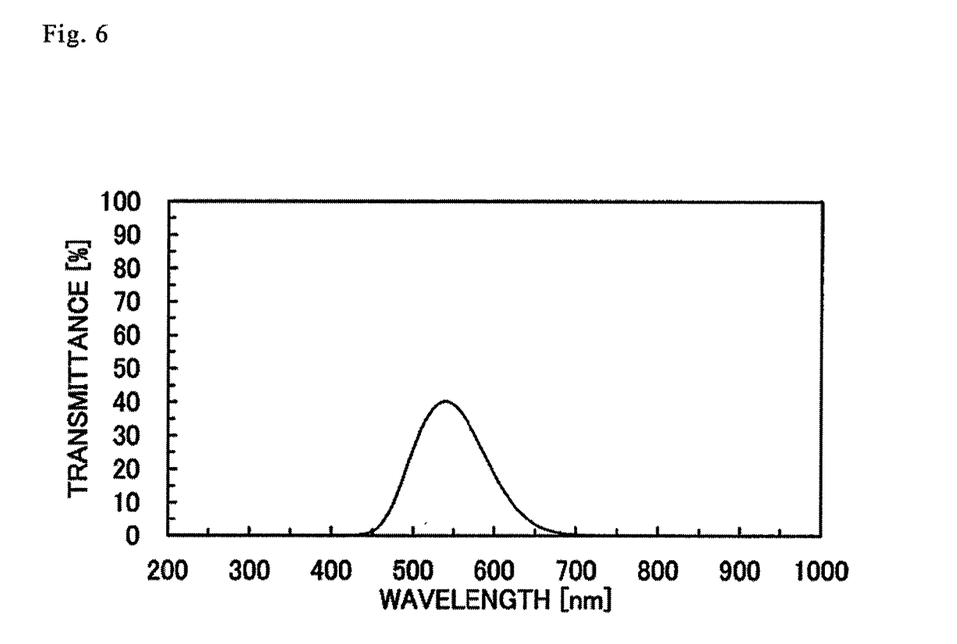
FIG. 6 is a view showing spectrum characteristics of the semiconductor device of the invention.

According to this composition, it is possible to provide spectral luminous efficacy properties in which the central peak of a transmittance is in a wavelength range of 540 nm to 560 nm, the transmittance in a wavelength range of 700 nm to 1200 nm is 2% or less, and the transmittance in a wavelength range of 300 nm to 430 nm is 3% or less. In addition, it is possible to provide weather resistance higher than that of phosphate-based glass in the related art. FIG. 6 shows spectrums of the spectral luminous efficacy properties which are obtained.

A comparison result between this example and a comparative example, which shows effectiveness of the composition, is shown in Table 1. Although being relative evaluation, it can be confirmed that spectral luminous efficacy properties shown in FIG. 6 and high weather resistance are compatible with each other by a composition and an addition amount in present Example A based on this example in Table 1. In a comparative experiment, it is considered that absence of BaO in Comparative Example B, and presence of $B_2O_3$ or $SiO_2$ in Comparative Example C or D have an unfavorable effect.

TABLE 1

| Composition/ Addition amount (%) | Present Example A | Comparative Example B | Comparative Example C | Comparative Example D |
|---|---|---|---|---|
| $P_2O_5$ | 40 to 60 | 50 to 70 | 40 to 60 | 40 to 60 |
| BaO | 20 to 40 | | | |
| $B_2O_3$ | | | | 1 to 10 |
| $SiO_2$ | | | 1 to 5 | |
| ($Al_2O_3$ + $La_2O_3$ + $Y_2O_3$) | 1 to 8 | 10 to 30 | 10 to 30 | |
| (ZnO + MgO + CaO + SrO) | 1 to 15 | 1 to 15 | 1 to 10 | |
| ($Li_2O$ + $Na_2O$ + $K_2O$) | 1 to 15 | 1 to 15 | 10 to 30 | 10 to 30 |
| CuO | 3 to 10 | 3 to 10 | 3 to 10 | 3 to 10 |
| $V_2O_5$ | 1 to 5 | 1 to 5 | 1 to 5 | 1 to 5 |
| NiO | 1 to 5 | 1 to 5 | 1 to 5 | 1 to 5 |
| Spectral luminous efficacy properties | ○ (good) | ○ (good) | X (poor) | Δ (mediocre) |
| Weather resistance | ○ (good) | X (poor) | ○ (good) | X (poor) |

In addition, the second phosphate-based glass that constitutes the frame 1 is intended to have light-shielding characteristics in which the transmittance in a wavelength range of 300 nm to 1200 nm is 2% or less, and a composition thereof contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 1% to 5% of CoO,
7) 3% to 10% of CuO,
8) 5% to 15% of $V_2O_5$, and
9) 1% to 5% of NiO.

When employing the two kinds of phosphate-based glass as laminated glass, it is possible to obtain an integrated glass lid member in which physical properties including a coefficient of expansion become close to each other, and a difference in the coefficient of expansion does not matter when employing the phosphate-based glass as a laminated glass member, and the same high weather-resistance level is provided.

In addition, the lid member has the following structure. The window 2, which has a dimension equal to or less than an inner diameter of an upper portion of the cavity and is constituted by the first phosphate-based glass, is disposed at and introduced to the central portion in an immediate upward direction of the optical sensor element 4 that is mounted on the center of the bottom portion of the element-mounting portion 3 having the cavity. According to this, with regard to a light-receiving angle range in which the optical sensor element can receive light beams through the window 2 constituted by the phosphate-based glass having the spectral luminous efficacy properties, it is possible to effectively receive light beams, which are transmitted through the window 2 having the spectral luminous efficacy properties, with respect to light beams from not only in an immediate upward direction but also in a wide angle range. As a result, it is possible to greatly improve angle dependence of light reception characteristics.

In addition, in the lid member, an opened site is provided in the second phosphate-based glass having a wafer shape and the light-shielding properties, and the first phosphate-based glass having the spectral luminous efficacy properties is embedded in the second phosphate-based glass to obtain a melted and integrated laminated glass member. According to this, a cut-out surface, which occurs in a case of being divided into individual pieces, disappears in the window 2 constituted by the first phosphate-based glass having the spectral luminous efficacy properties. A minute concavo-convexity exists in the cut-out surface. Therefore, in a case of performing introduction while the concave-convexity is left as is, when performing embedding, an air layer is likely to occur between two kinds of glass. In a case where the air layer occurs, light beams are reflected from the air layer, thus an interface state in which the air layer is left is not preferable. In addition, it is difficult to obtain delicate switching characteristics in absorption wavelength characteristics between the first phosphate-based glass having the spectral luminous efficacy properties and the second phosphate-based glass having the light-shielding properties with respect to external light beams. In addition, when the air layer is not left, it is possible to prevent cracking or peeling-off of glass due to expansion of air from occurring when a heat is applied to the air layer.

Description will be given to a method of forming the opened site. The opened site, which is provided in the wafer-shaped second phosphate-based glass having the light-shielding properties, is obtained as follows. Light-shielding glass in a wafer state is placed on a mold provided with a convex portion, and is put into a softening temperature atmosphere in a state in which a load is applied to the glass. After extraction, the light-shielding glass, in which a concave portion is formed, is polished to provide the opened site. In another way, a mask is provided on the light-shielding glass in a wafer state, and etching is performed in a state in which a portion to be the opened site is exposed, thereby providing the opened site. According to this, a surface of the opened site, which is exposed in a thickness direction, does not become a fracture surface, and a minute concavo-convexity like a cut-out surface also does not remain on the exposed surface. According to this, air is less likely to intrude into an interface when embedding the first phosphate-based glass 2 having the spectral luminous efficacy properties.

In addition, so as to form the phosphate-based glass having the spectral luminous efficacy properties, which is embedded into the opened site provided in the phosphate-based glass having the light-shielding properties, an ingot is made into a wafer state through dicing or by using a wire saw, and then the wafer is divided into individual pieces in a size capable of being accommodated in the opened site through the dicing or by using the wire saw. The individual pieces of phosphate-based glass having the spectral luminous efficacy properties are provided in the opened site provided in the wafer-shaped phosphate-based glass having the light-shielding properties, and are put into the softening temperature atmosphere in a state a load is applied to the glass. The phosphate-based glass having the light-shielding properties and the phosphate-based glass having the spectral luminous efficacy properties are in a temperature range close to the softening temperature, and a load is applied thereto. Accordingly, the glass is gradually deformed and flows into the opened site in a gradually softened state, and thus melting integration can be obtained.

In addition, when the phosphate-based glass having the spectral luminous efficacy properties is divided into individual pieces from the wafer state through dicing or by using a wire saw, and the individual pieces are put into an atmosphere that is set to appropriately the lower limit of a softening temperature, a concavo-convex, chipping, and the like, which remain on a processing surface, can be mitigated. As a result, it is possible to improve air-tightness in a glass interface during embedding.

In addition, since the lid member is constituted by glass, the lid member has higher reliability with respect to an environment such as heat and moisture in comparison to the lid member is constituted by a resin and the like. According to this, a variation in characteristics may not occur for a long period of time. In addition, even when changing the thickness or dimensions of the glass, the degree of freedom is high. Accordingly, in a case of designing the package to have a small thickness or a small size, it is possible to easily cope with the case through adjustment of grinding thickness of the glass, or through changing of dimensions during division into individual pieces.

Example 2

Figure 3:
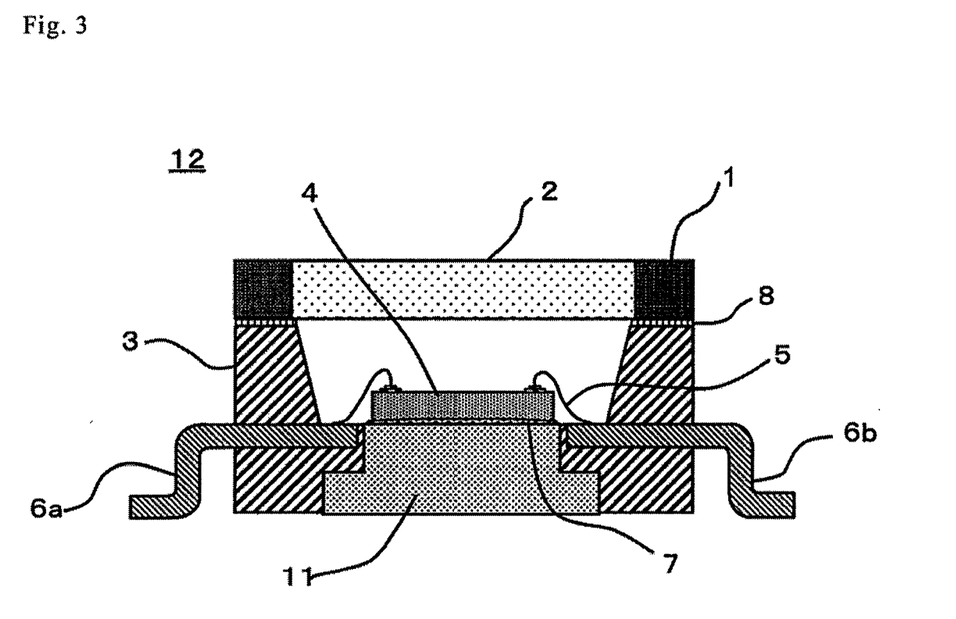
FIG. 3 is a cross-sectional view schematically showing a configuration of the semiconductor device of the invention.

FIG. 3 is a cross-sectional view of an optical sensor device 12 of this example. In addition to the structure of the optical sensor device of FIG. 1 which includes the element-mounting portion 3 having the cavity, and the lid member having a structure in which the frame 1 constituted by the phosphate-based glass having the light-shielding properties and the window 2 that is embedded in the opened site of the frame 1 and is constituted by the phosphate-based glass having the spectral luminous efficacy properties, an element-mounting portion, to which the optical sensor element 4 is stuck with an adhesive, is constituted by a mount portion 11 formed from a material having heat dissipation properties, and the mount portion 11 has a shape in which a rear surface opposite to a surface onto which the element 4 is stuck is exposed to an outer side.

According to this, it is possible to dissipate heat generated in the element 4 to an outer side through the mount portion 11.

Example 3

Figure 4:
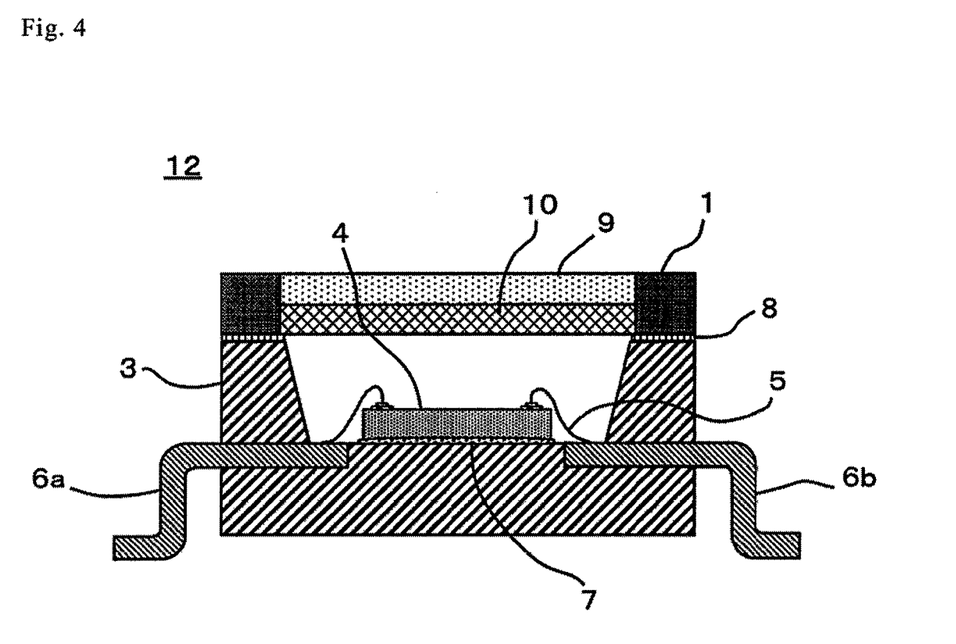
FIG. 4 is a cross-sectional view schematically showing a configuration of the semiconductor device of the invention.

FIG. 4 is a cross-sectional view of an optical sensor device 12 of this example. The optical sensor device 12 has a hollow structure constituted by the element-mounting portion 3 having the cavity, and a glass lid member. The glass lid member is a closely attached lid member, and includes the frame 1 constituted by the phosphate-based glass having the light-shielding properties, and a window that is introduced into the opened site formed in the frame 1 and is constituted by phosphate glass. Phosphate-based glass 9 that absorbs light beams in an infrared wavelength region in which the transmittance in a wavelength range of 700 nm to 1200 nm is 2% or less, and phosphate-based glass 10 that absorbs light beams in a ultraviolet wavelength region in which the transmittance in a wavelength range of 300 nm to 430 nm is 3% or less are superimposed on each other, and the resultant superimposed glass is divided into individual pieces. The individual pieces of glass are introduced into the window, and the individual pieces, of glass and the frame are integrally formed as a laminated glass member.

Here, the lid member constituted by the phosphate-based glass include the glass having a structure in which the phosphate-based glass 9 that absorbs light beams in an infrared wavelength region, and the phosphate-based glass 10 that absorbs light beams in a ultraviolet wavelength region are superimposed on each other, and the frame 1 constituted by the phosphate-based glass having the light-shielding properties. An opened site is provided in advance in the frame constituted by the phosphate-based glass having the light-shielding properties, and individual pieces of the phosphate-based glass 9 and the phosphate-based glass 10 which are superimposed on each other are embedded in the opened site Here, a sequence of superimposing the phosphate-based glass 9 and the phosphate-based glass 10 is not particularly limited.

The phosphate-based glass 9 is intended to absorb light beams in an infrared wavelength region, and the transmittance in a wavelength range of 700 nm to 1200 nm is 2% or less. A composition of the phosphate-based glass 9 contains, in terms of % by weight, 1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 1% to 5% of CoO,
7) 3% to 10% of CuO,
8) 5% to 15% of $V_2O_5$, and
9) 1% to 5% of NiO.

In addition, the phosphate-based glass 10 is intended to absorb light beams in an ultraviolet wavelength region, and the transmittance in a wavelength range of 300 nm to 430 nm is 3% or less. A composition of the phosphate-based glass 10 contains, in terms of % by weight,
1) 40% to 60% of $P_2O_5$,
2) 20% to 40% of BaO,
3) $Al_2O_3$, $La_2O_3$, and $Y_2O_3$ in a total amount of 1% to 8%,
4) ZnO, MgO, CaO, and SrO in a total amount of 1% to 15%,
5) $Li_2O$, $Na_2O$, $K_2O$ in a total amount of 1% to 15%,
6) 3% to 10% of CuO,
7) 1% to 5% of $V_2O_5$, and
8) 1% to 5% of NiO.

According to the compositions, the phosphate-based glass 9 and the phosphate-based glass 10 can have the above-described light-transmitting characteristics and high weather resistance. FIG. 6 shows spectrums of spectral luminous efficacy properties which are obtained. The vertical axis represents a transmittance, and the horizontal axis represents a wavelength. Although being different in an absorption wavelength range, the phosphate-based glass 9 and the phosphate-based glass 10, and the phosphate-based glass having the light-shielding properties are constituted by using phosphate-based glass through composition changing. Accordingly, physical properties including a difference in a coefficient of expansion become close to each other. In addition, in the lid member that is integrally formed as the laminated glass member, cracking or peeling-off does not occur, and it is possible to provide weather resistance higher in comparison to phosphate-based glass in the related art.

In addition, with regard to the laminated glass in which the phosphate-based glass 9 that absorbs light beams in an infrared wavelength region in which the transmittance in a wavelength range of 700 nm to 1200 nm is 2% or less, and the phosphate-based glass 10 that absorbs light beams in a ultraviolet wavelength region in which the transmittance in a wavelength range of 300 nm to 430 nm is 3% or less are superimposed on each other, glass wafers which are highly flattened through polishing are superimposed on which other, and then a load is applied thereto. Then, the superimposed wafers are put into a softening temperature atmosphere furnace set to a vacuum atmosphere or a nitrogen atmosphere so as to obtain laminated glass. In addition, the laminated glass may be obtained as follows. Specifically, the glass wafers after being polished are subjected to a chemical treatment with an acid, and is subjected to drying and annealing so as to be an activation state. The glass wafers are superimposed on each other, and a load is applied thereto. Then, the glass wafers are put into a high-temperature furnace set to a vacuum or nitrogen atmosphere. According to this, the laminated glass is obtained.

In addition, the laminated glass in which the phosphate-based glass 9 and the phosphate-based glass 10 are superimposed on each other may be obtained as follows. Specifically, after being highly flattened through polishing, glass wafers are subjected to a chemical treatment with an acid, and drying and annealing. Then, the glass wafers are superimposed on each other by using an adhesive, and then the glass wafers are cured. According to this, the laminated glass is obtained. In addition, as the adhesive, a diluted coupling agent may be used. In this case, it is possible to form a very thin adhesive layer, and it is possible to realize laminated glass with high adhesive strength.

The laminated glass in which the phosphate-based glass 9 and the phosphate-based glass 19 are superimposed on each other are divided into individual pieces having an embedding size through dicing or by using a wire saw, and the individual pieces are embedded in the opened site provided in the frame 1 constituted by the phosphate-based glass having the light-shielding properties and are melt-integrated to obtain the glass lid member.

Example 4

Figure 5:
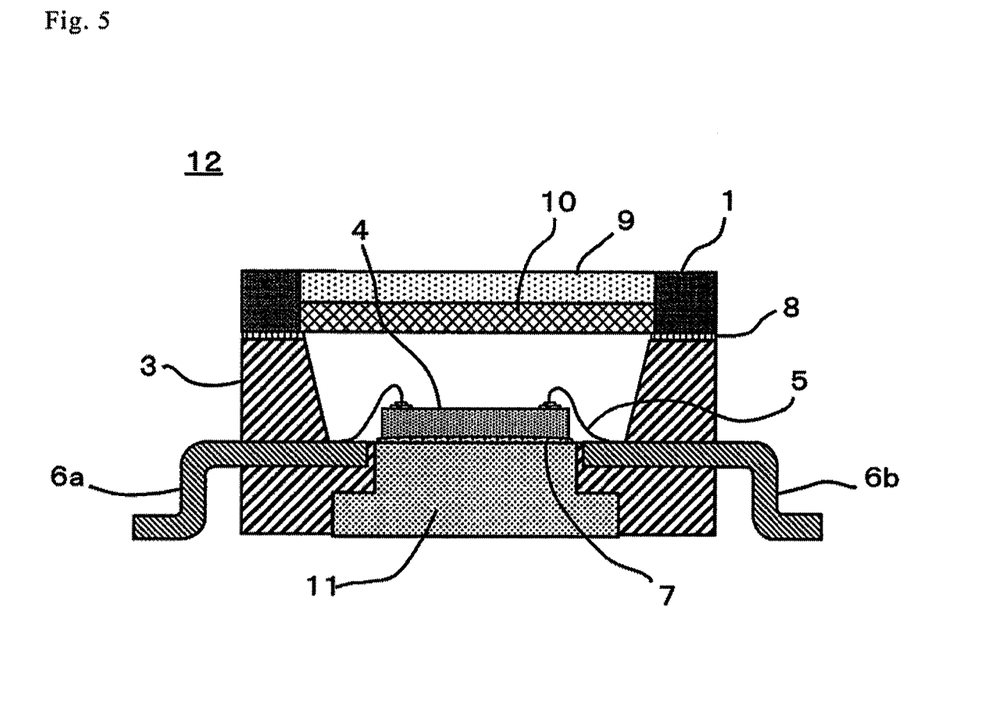
FIG. 5 is a cross-sectional view schematically showing a configuration of the semiconductor device of the invention.

FIG. 5 is a cross-sectional view of an optical sensor device 12 of this example. In addition to configuration of the optical sensor device in FIG. 3 which includes the element-mounting portion 3 having the cavity, and the closely attach lid member, and has a structure in which individual pieces of the glass, in which the phosphate-based glass 9 that absorbs light beams in an infrared wavelength region in which the transmittance in a wavelength range of 700 nm to 1200 nm is 2% or less, and the phosphate-based glass 10 that absorbs light beams in a ultraviolet wavelength region in which the transmittance in a wavelength range of 300 nm to 430 nm is 3% or less are superimposed, are embedded in the opened site provided in the frame 1 constituted by the phosphate-based glass having the light-shielding properties, an element-mounting portion, to which the element 4 is stuck with an adhesive, is constituted by a mount portion 11 formed from a material having heat dissipation properties, and the mount portion 11 has a shape in which a rear surface opposite to a surface onto which the element 4 is stuck is exposed to an outer side. According to this, it is possible to dissipate heat generated in the element 4 to an outer side through the mount portion 11.

INDUSTRIAL APPLICABILITY

The optical sensor device using the package, in which the lid member and the element-mounting portion having the cavity are closely attached to each other, has the hollow structure in which the phosphate-based glass formed as laminated glass having spectral luminous efficacy properties and high weather resistance is used as the lid member. Accordingly, it is possible to provide spectral luminous efficacy properties less susceptible to an effect such as heat and moisture, and high reliability. In addition, spectral luminous efficacy properties of light beams, which are received by the light-receiving element, can be obtained in a wide angle range including not only a direction in an immediate upward direction of the element, and an oblique direction. As a result, it is possible to greatly improve angle dependence.

In addition, the phosphate-based glass has a composition having transmittance characteristics, in which a light beam of a wavelength in an ultraviolet region and a light beam of a wavelength in an infrared region is 3% to 2%, in spectral luminous efficacy properties, and high weather resistance. According to this, in comparison to a configuration in which the spectral luminous efficacy properties are provided by resin, an absorbance of an ultraviolet wavelength and an infrared wavelength is higher, and more satisfactory spectral luminous efficacy properties are obtained. In addition to this, the phosphate-based glass is less susceptible town ambient environment, and a variation with the passage of time is also small. According to this, it is possible to provide an optical sensor device in which deterioration in characteristics is small. As a result, the phosphate-based glass can contribute to supply of the optical sensor device to a television, a household electric appliance, and a portable terminal, and further an optical sensor device mounted apparatus with concern of an in-vehicle use or an outdoor use in more severe environments.

REFERENCE SIGNS LIST

1: Frame, which is formed phosphate-based glass having light-shielding properties, of lid member 2: Window, which is formed from phosphate-based glass having spectral luminous efficacy properties, of lid member
3: Element-mounting portion having cavity
4: Optical sensor element
5: Wire
6a, 6b, 6c, 6d: Lead frame
7: Adhesive of element
8: Sticking agent of lid member
9: Phosphate-based glass absorbing light beam in infrared wavelength region
10: Phosphate-based glass absorbing light beam in ultraviolet wavelength region
11: Optical sensor element-mounting portion having heat dissipation properties
12: Optical sensor device

The invention claimed is:

1. An optical sensor device having a hollow structure in which a lid member and an element-mounting portion having a cavity are closely attached to each other, the optical sensor device comprising:
   an optical sensor element provided on a bottom portion of the element-mounting portion; and
   a lead frame in which one end is exposed to an inner side of the cavity, and another end is led to an outer side of the element-mounting portion and functions as an external terminal,
   the lid member and the element-mounting portion being formed from phosphate-based glass,
   the lid member having a window formed from first phosphate-based glass having a spectral luminous efficacy properties, and having a frame formed from second phosphate-based glass having light-shielding properties, and
   the lid member having a structure in which the window formed from the first phosphate-based glass having the spectral luminous efficacy properties in an immediate upward direction of the center of the element-mounting portion is embedded in and integrated with the frame that surrounds the periphery of the window and is formed from the second phosphate-based glass having the light-shielding properties.

2. The optical sensor device according to claim 1,
   wherein the lid member is constituted by a laminated glass member in which individual pieces of the first phosphate-based glass having the spectral luminous efficacy properties are embedded in an opened site provided in the second phosphate-based glass that has a wafer shape and the light-shielding properties, and are melted to be integrated with the second phosphate-based glass.

3. The optical sensor device according to claim 1,
   wherein the first phosphate-based glass having the spectral luminous efficacy properties has characteristics in which a central peak of a transmittance is in a wavelength range of 540 nm to 560 nm, a transmittance in a wavelength range of 700 nm to 1200 nm is 2% or less, and a transmittance in a wavelength range of 300 nm to 430 nm is 3% or less, and
   the second phosphate-based glass having the light-shielding properties has characteristics in which a transmittance in a wavelength range of 300 nm to 1200 nm is 2% or less.

4. The optical sensor device according to claim 1,
   wherein the first phosphate-based glass having the spectral luminous efficacy properties is individual pieces of glass composed of either one kind of glass having characteristics in which a central peak of a transmittance is in a wavelength range of 540 nm to 560 nm, a transmittance in a wavelength range of 700 nm to 1200 nm is 2% or less, and a transmittance in a wavelength range of 300 nm to 430 nm is 3% or less, or individual pieces of glass in which two kinds of glass including phosphate-based glass with a transmittance in a wavelength range of 700 nm to 1200 nm is 2% or less, and phosphate-based glass with a transmittance in a wavelength range of 300 nm to 430 nm is 3% or less are superimposed on each other.

5. The optical sensor device according to claim 1,
   wherein a composition of the first phosphate-based glass having the spectral luminous efficacy properties contains, in terms of % by weight,
   1) 40% to 60% of $P_2O_5$,
   2) 20% to 40% of BaO,
   3) $Al_2O_3$, $La_2O_3$, and $Y_2O_3$ in a total amount of 1% to 8%,
   4) ZnO, MgO, CaO, and SrO in a total amount of 1% to 15%,
   5) $Li_2O$, $Na_2O$, $K_2O$ in a total amount of 1% to 15%,
   6) 3% to 10% of CuO,
   7) 1% to 5% of $V_2O_5$, and
   8) 1% to 5% of NiO.

6. The optical sensor device according to claim 1,
   wherein a composition of the second phosphate-based glass having the light-shielding properties contains, in terms of % by weight,
   1) 40% to 60% of $P_2O_5$,
   2) 20% to 40% of BaO,
   3) $Al_2O_3$, $La_2O_3$, and $Y_2O3$ in a total amount of 1% to 8%,
   4) ZnO, MgO, CaO, and SrO in a total amount of 1% to 15%,
   5) $Li_2O$, $Na_2O$, $K_2O$ in a total amount of 1% to 15%,
   6) 1% to 5% of CoO,
   7) 3% to 10% of CuO,
   8) 5% to 15% of $V_2O_5$, and
   9) 1% to 5% of NiO.

7. The optical sensor device according to claim 1,
   wherein the bottom portion includes a mount portion on which the optical sensor element is provided, and
   the mount portion has a shape in which a rear surface opposite to a surface on which the optical sensor element is provided is exposed from the element-mounting portion to an outer side.

* * * * *

UNITED STATES PATENT AND TRADEMARK OFFICE
CERTIFICATE OF CORRECTION

| | | |
|---|---|---|
| PATENT NO. | : 9,691,914 B2 | Page 1 of 1 |
| APPLICATION NO. | : 15/117077 | |
| DATED | : June 27, 2017 | |
| INVENTOR(S) | : Koji Tsukagoshi and Noriyoshi Higashi | |

It is certified that error appears in the above-identified patent and that said Letters Patent is hereby corrected as shown below:

On the Title Page

Item (87), the PCT publication number "WO2015/122565" should be changed to --WO2015/125565--.

Signed and Sealed this
Seventh Day of May, 2019

Andrei Iancu
*Director of the United States Patent and Trademark Office*